US009325304B2

(12) United States Patent
Wang

(10) Patent No.: US 9,325,304 B2
(45) Date of Patent: Apr. 26, 2016

(54) APPARATUS FOR CONTROLLING COMPARATOR INPUT OFFSET VOLTAGE

(71) Applicant: Meng Wang, Tianjin (CN)

(72) Inventor: Meng Wang, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 313 days.

(21) Appl. No.: 14/165,595

(22) Filed: Jan. 28, 2014

(65) Prior Publication Data

US 2014/0253205 A1 Sep. 11, 2014

(30) Foreign Application Priority Data

Mar. 11, 2013 (CN) .......................... 2013 1 0201046

(51) Int. Cl.
*H03L 5/00* (2006.01)
*H03K 5/24* (2006.01)

(52) U.S. Cl.
CPC .................................... *H03K 5/2481* (2013.01)

(58) Field of Classification Search
CPC ............................... H03K 5/003; H03K 5/007
USPC ........ 327/307, 65–71; 330/253; 341/118, 172
See application file for complete search history.

(56) References Cited

U.S. PATENT DOCUMENTS

| 6,362,687 | B2 | 3/2002 | Cox |
| 6,614,301 | B2 | 9/2003 | Casper |
| 8,127,156 | B2 | 2/2012 | Hennecke |
| 8,330,499 | B2 | 12/2012 | Hirose |
| 2011/0133966 | A1* | 6/2011 | Ono ..................... H03M 1/0607 341/118 |

OTHER PUBLICATIONS

Mashhadi, S.B., Nasrollaholosseini, S.H., Sepehrian, H., Lotfi, R., "An Offset Cancellation Technique for Comparators Using Body-Voltage Trimming", New Circuits and Systems Conference (NEWCAS), 2011 IEEE 9th International, Jun. 26-29, 2011, pp. 273-276.

Gebara, F.H., Martin, S.M., Kraver, K.L., Brown, R.B. "A Body-Driven Offset Cancellation Technique in PD-SOI", Microelectronics, 2004, 24th International Conference, May 16-19, 2004, pp. 567-570, vol. 2.

Bacinschi, P.B., Murgan, T., Koch, K., Glesner, M., "An Analog On-Chip Adaptive Body Bias Calibration for Reducing Mismatches in Transistor Pairs", Design, Automation and Test in Europe, 2008. DATE '08, Mar. 10-14, 2008, pp. 698-703.

* cited by examiner

*Primary Examiner* — Lincoln Donovan
*Assistant Examiner* — Thomas Skibinski
(74) *Attorney, Agent, or Firm* — Charles E. Bergere

(57) ABSTRACT

An apparatus to remove an input offset voltage of a comparator circuit includes an input voltage offset capacitor, control logic to charge and discharge the capacitor to provide an offset cancelation voltage. The offset cancellation voltage removes the input offset voltage of the comparator dependent upon an output of the comparator circuit. A switching arrangement controlled by the control logic switches signals between the capacitor and the control logic.

16 Claims, 6 Drawing Sheets

US 9,325,304 B2

APPARATUS FOR CONTROLLING COMPARATOR INPUT OFFSET VOLTAGE

BACKGROUND OF THE INVENTION

The present invention relates to comparators and, more particularly, to controlling input offset voltages in comparators.

A comparator is an operational cell/unit commonly used in modern analog and/or mixed-signal integrated circuits. For example, a comparator may be the principle part of an analog-to-digital converter (ADC) and can have a significant impact on the resultant performance of any integrated circuit including the ADC. When used in an ADC, the comparator can strongly affect the ADC's resolution. A comparator's performance can be affected by a number of things such as component device mismatches caused by manufacturing process variations and the like. These mismatches can result in a comparator having significant input offset voltage(s), which affects the output, therefore resulting in non-ideal performance, and so it is critical to control the input offset voltage. The input offset voltage may be defined as a Direct Current (DC) voltage difference that occurs between the two differential inputs of the amplifier circuit within a comparator, for example an operational amplifier (op-amp) circuit. The voltage difference may be overcome by applying a suitably sized polar opposite bias voltage so that the comparator output is actually zero when the two input voltages are nominally the same. The provision and application of such input offset voltage(s) may be done by offset cancellation circuits, and among the different types of offset cancellation circuits, body biasing approaches are commonly used.

Most body biasing methods need a high gain auxiliary amplifier in an offset cancellation phase, but this high gain auxiliary amplifier requires additional space, which can increase die size, and equally importantly, the high gain auxiliary amplifier itself has an inherent input offset, meaning the auxiliary amplifier itself will degrade the overall offset cancellation performance of resultant comparator.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

The illustrated embodiments of the present invention may for the most part, be implemented using electronic components and circuits known to those skilled in the art. Therefore, details will not be explained in any greater extent than that considered necessary as illustrated above, for the understanding and appreciation of the underlying concepts of the present invention and in order not to obfuscate or distract from the teachings of the present invention.

The present invention provides an apparatus to remove an input offset voltage of a comparator circuit, and an associated method. These and other aspects of the invention will be apparent from and elucidated with reference to the embodiments described hereinafter.

Examples of the present invention may be used in, for example, Successive Approximation Register (SAR) type ADCs, or any other circuit that utilises a comparator. A SAR ADC is a particular type of ADC that converts an input analog signal waveform into a discrete digital representation by carrying out a binary search through all possible quantization levels before finally converging upon a final closest match digital output for a given conversion. This process uses an analog voltage comparator to compare an input voltage, Vin, to the output of the internal digital to analog converter (DAC), which outputs the result of the comparison to a successive approximation register (SAR), which is a sub-circuit designed to supply an approximate digital code representation of Vin to the internal DAC. Thus, in effect, a SAR ADC tests a ramping (e.g., up) generated digital signal against an input signal until they match.

Figure 1A:
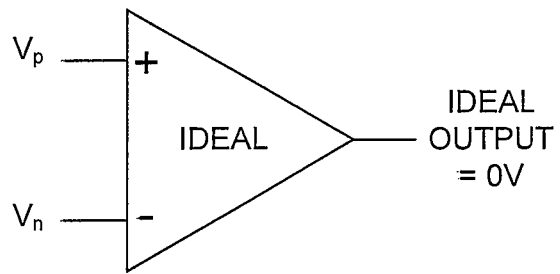
FIGS. 1A to 1C show an ideal comparator, a real life comparator, and a real life comparator with a read signal, respectively.

FIG. 1A shows an ideal comparator having a positive (non-inverting) input voltage Vp and a negative (inverting) input voltage Vn, and an ideal output voltage. In the example configuration of FIG. 1A, if Vp>Vn the output is driven to the positive supply rail (Vdd), whereas if Vp<Vn then the output is driven to the negative rail (Vss), and, finally, if the two input voltages are equal (Vp=Vn), the output is 0V. Vp may also be referred to as the positive input, or non-inverting input, and Vn may also be referred to as simply the negative input, or the inverting input.

Figure 1B:
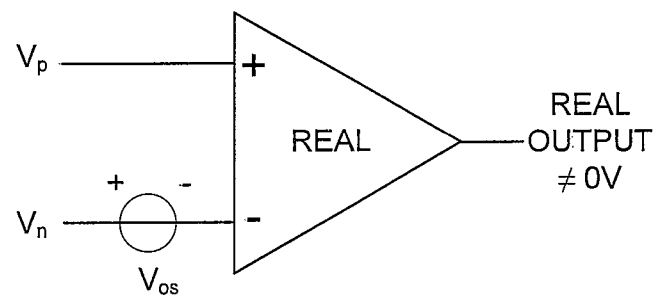

FIG. 1B shows that a real life comparator does not act in this ideal way, because there is actually an effective input offset voltage, which is like a small positive voltage applied to the Vn input as shown (or could equally be seen as a reverse polarity small voltage on the Vp input—not shown). This may result in there being an effective voltage difference between Vn and Vp, so the comparator's inverting input (Vn) is not equal with its non-inverting input (Vp), even when Vn and Vp are in fact equal. This results in a very small, but not insignificant voltage difference—for example in the region of 10 to 20 mV. The polarity of these voltages will depending on whether the input offset is effectively on the Vn or Vp side, respectively.

Regardless of actual specific use, many real life comparators will have an offset cancellation structure to remove this input offset voltage before the comparison occurs, and that will typically use an auxiliary amplifier in offset calibration mode, i.e. forming and (pre-)applying a suitable voltage to counteract the input offset voltage.

Figure 1C:
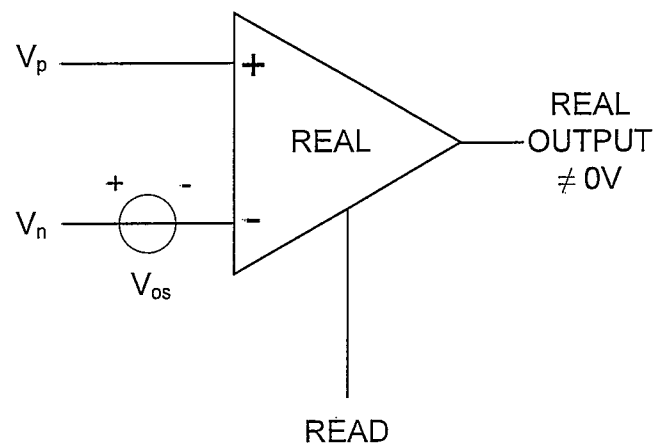

FIG. 1C shows such a comparator, and now further incorporates a READ control signal, so that the comparator may go through an initialization and offset cancelation phase (or phases) prior to the signals being applied to Vn and VP, respectively, or being actually compared and an output signal read out of the comparator as a whole.

It can be seen from the above description of FIGS. 1A to 1C that the input voltage offset, if present, introduces an offset at the output of the comparator when there should not be one, given the nominally equal input voltage levels (i.e. when the two input voltages to the differential amplifier forming the core of the comparator are equal, the output should be zero, but due to the aforementioned input voltage offsets, the output actually becomes non-zero). However, examples of the present invention avoid the use of an additional auxiliary amplifier to provide the offset cancelation. This means the resultant comparator is less complex, smaller in die size (and therefore lower cost, lower power consumption, etc.), but also cannot suffer from any offset that would have been introduced by the additional auxiliary amplifier itself. Examples of the present invention are therefore much nearer to 100% effective at removing the input voltage offset, without the need for yet further complex auxiliary amplifier offset calibration. Instead, examples of the present invention use the comparator itself, to drive an attendant feedback driven control logic to control the charging or discharging of a capacitor arranged to provide a suitably sized body bias offset voltage back onto a one of the differential transistors of the comparator, as described in more detail below.

Comparators are usually formed from transistors, such as NMOS and PMOS transistors, with a significant component being a differential amplifier formed of two nominally identical transistors, such as two NMOS or two PMOS transistors, in a differential arrangement (i.e. in linked opposing form) to detect and amplify a difference between their respective gate voltages.

Accordingly, in general terms, examples of the present invention provide a comparator arrangement having a capacitor, feedback loop with control logic and switching arrangement arranged to control the charging and discharging of the capacitor, so that the capacitor is operational to remove (i.e., bias away) the input offset voltage of the comparator (e.g., due to unwanted/unintended manufacturing process variations affecting the parameters of the transistors forming the comparator).

Accordingly, there is provided a new offset cancellation phase for a comparator, in which the positive and negative inputs to the operational amplifier forming the core of a comparator may be biased to a common voltage, so they are nominally the same voltage, and hence ensuring the output of the comparator is actually zero when it should be zero. The body of a first PMOS transistor (e.g., M0 in later figures) of a respective differential input pair of the comparator may be charged or discharged, under control of a feedback loop. The body of another second PMOS transistor (e.g., M1 in later figures) of the respective input pair may be always connected with its source. The body may be charged or discharged depending on the input offset's polarity, e.g. if the offset voltage (Vos) is >0, then the body of the transistor (e.g. M0) may be charged so that its voltage is higher than the other transistor's (e.g. M1) body. Whereas, if Vos is <0, then M0's body may be discharged so that its voltage is less than M1's body. As soon as an output of the comparator changes its state (i.e. moves from high to low, or vice versa), the first PMOS transistor body's charging/discharging activity will stop and that body voltage may be stored in a offset cancelation capacitor. Thus, an equal and opposite voltage to the inherent input offset voltage of the comparator (due to, e.g. manufacturing process variation, etc.) is stored and available for use in actively cancelling the input offset voltage. This is to say, the described method and apparatus results in different effective threshold voltages of the PMOS (for NMOS if applicable) transistors in an offset cancellation (voltage storage) phase, so that in the subsequent compare phase, the different body voltages will counteract the input offset voltage, so that the comparator will generate a correct output.

Examples of the invention may provide an apparatus to remove an input offset voltage of a comparator circuit, comprising an input voltage offset capacitor (coupled to a one of the input transistors of the comparator, i.e. one of the differentially connected input transistors), control logic operable to charge or discharge the input voltage offset capacitor to provide an offset cancelation voltage operable to remove the input offset voltage of the comparator dependent upon an output of the comparator circuit, and a switching arrangement operable under control of the control logic to switch signals between the input voltage offset capacitor and the control logic.

The input voltage offset capacitor may be operable to remove the input offset voltage of the comparator by altering the body bias voltage of a one of a plurality of input transistors of the comparator circuit. The input transistors of the comparator circuit may comprise a differential input arrangement, as normally used in a comparator, and often formed of two opposing transistors.

The input voltage offset capacitor may be arranged between a body of the one of the plurality of input transistors of the comparator circuit and a reference voltage (i.e. a predetermined voltage such as ground).

The control logic may comprise a charge control circuit operable to control the charging of the input voltage offset capacitor and a discharge control circuit operable to control the discharging of the input voltage offset capacitor. The charge control circuit and discharge control circuit may comprise an arrangement of AND and NOT gates, and latching logic, as disclosed below.

The control logic may comprise at least two NOT gates in series operably coupled to the output of the comparator circuit and arranged to provide a first control signal (OUTA) and a second control signal (OUTB), wherein the first control signal (OUTA) controls a charge control circuit and the second control signal (OUTB) controls the discharge control circuit. The first control signal (OUTA) may be the output of the second NOT gate and the second control signal (OUTB) may be the output of the first NOT gate.

The control logic further may comprise a D-Latch operably coupled after the two NOT gates to provide a latched output of the comparator under control of a read signal. The switching arrangement may comprise a first switching means operably coupled between an input signal (e.g. Vsig) and a second input of the comparator, and activated by a comparison signal. The second input of the comparator may be the inverting input of the comparator.

The switching arrangement may comprise a second switching means coupled between the second input of the comparator and a first input of the comparator, and activated by an offset activation signal (e.g. AZ 220, discussed below). The first input of the comparator may be the non-inverting input of the comparator.

The switching arrangement may comprise a third switching means coupled between the second input of the comparator and a reference voltage, and activated by an initialization signal. The first input of the comparator may be operably coupled to a reference voltage, e.g. Vref. The switching arrangement may comprise a fourth switching means (e.g. switch 311 discussed below) coupled between the body and source of a one of the input transistors of the comparator (i.e. one of the input differential transistors—M0 or M1 noted below—and M0 in the described examples) to which the input voltage offset capacitor is coupled.

The charge control circuit may be operably dependent upon the first control signal (OUTA) and an offset activation signal, (e.g. AZ 220, discussed below) and the discharge control circuit may be operably dependent upon the second control signal (OUTB) and the offset activation signal.

Examples also provide a method of removing an input offset voltage from a comparator comprising charging or discharging an input voltage offset capacitor coupled between a body of a one of a plurality of input differential transistors forming the comparator when another one of the plurality of input differential transistors forming the comparator has its source and body coupled together, wherein the charging or discharging of the input voltage offset capacitor occurs in response to a signal dependent upon a change of output of the comparator due to the input offset voltage acting on nominally equal input voltages. The method may further comprise an initialisation by initially charging the input voltage offset capacitor to equal a reference voltage by means of a plurality of switching means.

In the described method the charging may be used for an apparent positive input offset voltage acting on an inverting input of the comparator, whereas discharging may be used for an apparent negative input offset voltage acting on the inverting input of the comparator.

The method may further comprise comparing two inputs voltages with the comparator in a comparison stage occurring after an initialization and/or input offset voltage removal.

Examples also provide an apparatus for removing an input offset voltage of a comparator without using an auxiliary amplifier circuit, by using the comparator itself to control charging or discharging of an input voltage offset capacitor coupled to a one of a plurality of input transistors of the comparator by control logic dependent on the output of the comparator and a plurality of external activation signals, wherein the control logic is operable to charge or discharge the input voltage offset capacitor to a voltage level operable to remove the input offset voltage.

The apparatus may further comprise switching means operable to initialise the input voltage offset capacitor to an initial charge state where the plurality of input transistor of the comparators have nominally equal input voltages.

Examples also provide a method of removing an input offset voltage from a comparator comprising using a suitably charged input voltage offset capacitor, coupled between a one of a plurality of input differential transistors forming the comparator when another one of the input differential transistors forming the comparator has its source and body coupled together, to apply a suitable body bias voltage to a one of the plurality of input differential transistors forming the comparator and using the comparator itself and control logic operably coupled to the comparator and dependent on the output of the comparator to control charging or discharging of the input voltage offset capacitor.

Figure 2:
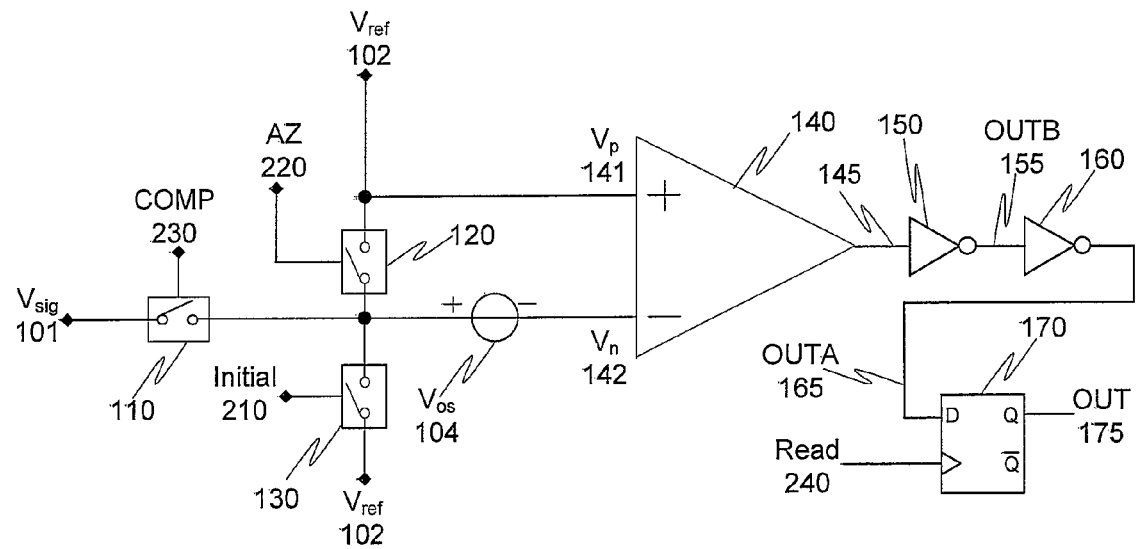
FIG. 2 shows a high level schematic diagram of a comparator circuit having offset calibration/removal according to an example of the present invention.

FIG. 2 shows a high level schematic diagram of a comparator circuit having offset calibration/removal according to an example of the present invention. In particular, FIG. 2 includes a comparator (which may also be referred to as operational amplifier) 140 having a positive input voltage Vp 141 and a negative input voltage Vn 142. In this example, the offset voltage (Vos) 104 is shown as a voltage applied to the Vn input 142. The comparator 140 has external switches 110, 120 and 130, in a switching arrangement, to variously connect respective inputs of the comparator (Vp 141 and Vn 142) to respective input voltages, Vref 102 and Vsig 101, and each other. Vref 102 is the reference voltage for use on a one of the comparator's 140 inputs. In this case the reference voltage, Vref 102, is for use on the comparator's positive input, Vp 141. In practical designs, Vref 102 may be generated by a bandgap circuit, for example, to be in the range of ~1.2V. Of course other options may be used instead, such as using an amplifier to get a higher voltage Vref, and with certain ratio of bandgap, and the like. For the described PMOS based comparator, its input stages (i.e. the differential amplifier comprising two transistors, M0 and M1) are PMOS, so Vref 102 may not be too high in value, otherwise the PMOS transistors may not be turned on.

In FIG. 2, there is provided a first switch 110 that is arranged to connect the signal voltage Vsig 101 (i.e. the signal to be compared), to a one of the comparator inputs, Vn 142 in this example, under control of a COMP signal 230 (i.e. the comparison signal, described below in more detail). Meanwhile, a second switch 120 is arranged to connect the two input Vp 141 and Vn 142 together under control of an AZ signal 220 (the offset calibration phase signal, also described below in more detail), and a third switch 130 is arranged to connect the negative input, Vn 142 to the reference voltage, Vref 102, under control of an initial signal 210 (i.e. initialization signal, also described below in more detail). Each of the switches 110, 120 and 130 may be any suitable type, for example they may be a set of one or more further NMOS and/or PMOS transistors arranged in the form of a parallel switch, noting a key parameter of the chosen switch is a suitable level of charge injection and clock feed-through impact.

On the output of the comparator 140, there is a "raw output", 145 that feeds into a first NOT gate (or inverting unit) 150, which provides a signal called OUTB 155, which is the inverse (in binary logic terms) of the raw output 145. This, in turn, feeds into a second NOT gate (or inverting unit) 160, which provides a signal called OUTA 165. The use of OUTA 165 and OUTB 155 are described below in more detail. Finally, OUTA 165 feeds into a latch, e.g. D-type Latch 170, which provides a way to latch the output of the overall comparator circuit for reading, under control of the READ signal 240.

Figure 3:
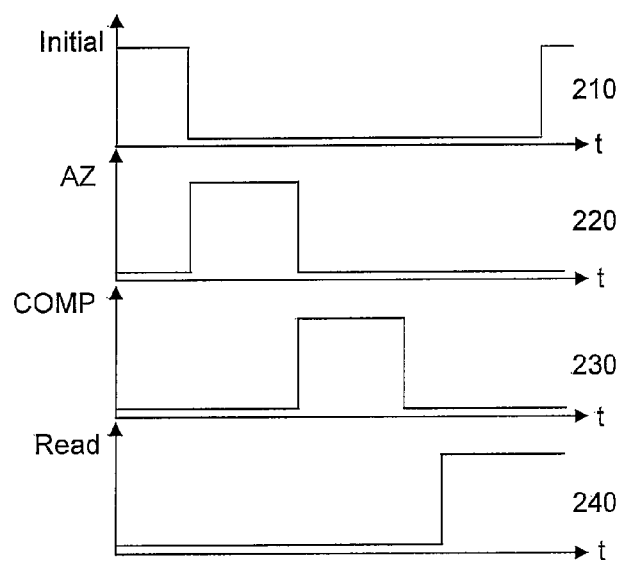
FIG. 3 shows the timing diagram of the relevant operational signals for the comparator circuit shown in FIG. 2.

FIG. 3 shows the timing diagram of the relevant operational signals, Initial 210, AZ 220, COMP 230 and READ 240 for the overall comparator circuit shown in FIG. 2. In summary, the initialization signal, initial 210, resets the whole comparator to an initial state (this signal also controls other switches, e.g. an "internal" switches described later, in FIGS. 4 and 5), the AZ signal 220 is an offset removal phase control signal, the COMP 230 signal is a comparison control signal—which controls the moment of actual comparison between Vref 102 to Vsig 101 by comparator 140, and Read 240 signal is for the read phase. In further summary, Initial 210 is active for setting the initial state of circuits, AZ 220 is active for the offset cancellation phase, COMP 230 is active for the compare phase, and Read 240 is active for reading output of comparator 140 and writing into latch (e.g. of ADC, utilising the example comparator).

Figure 4:
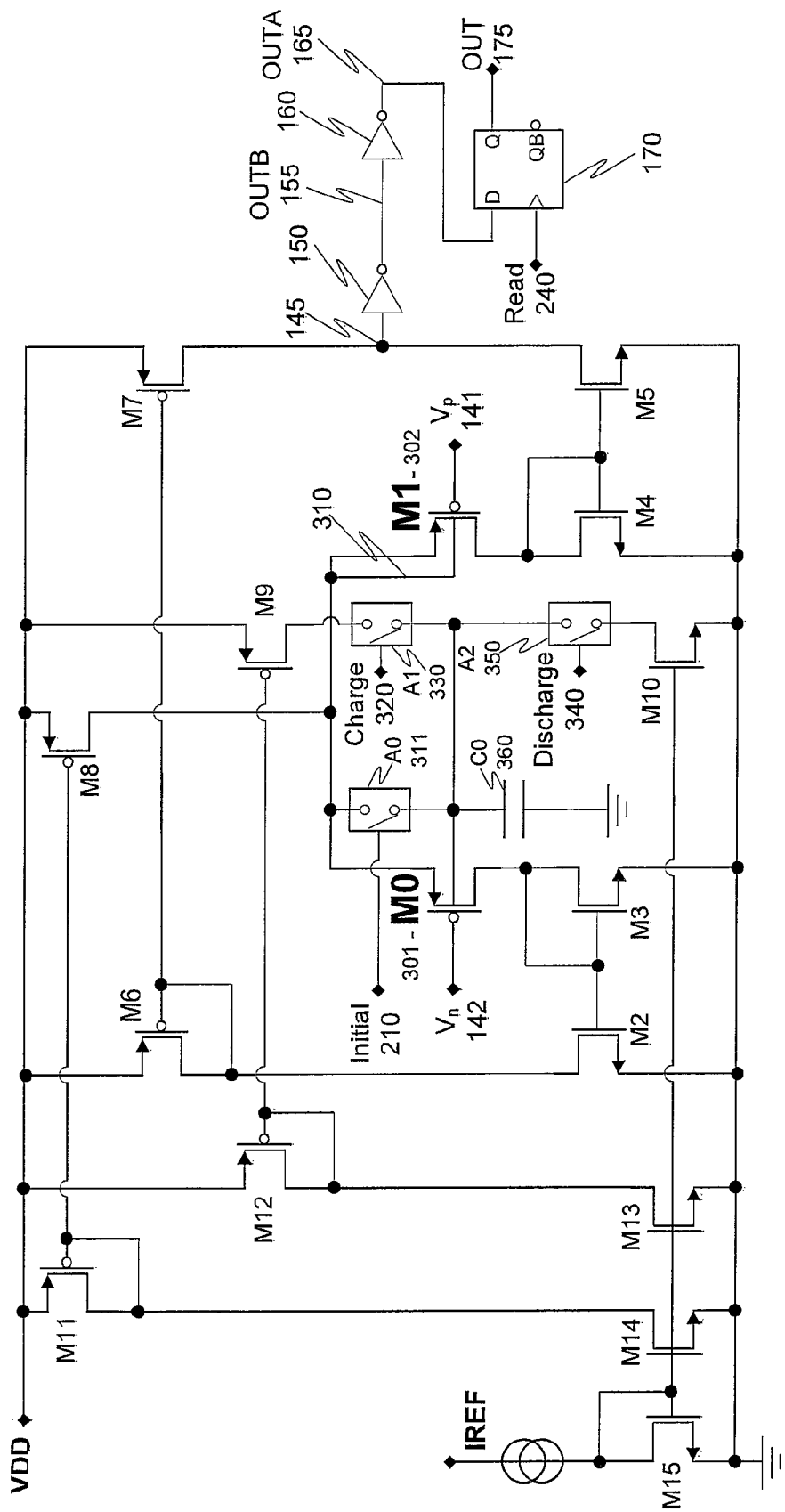
FIG. 4 shows a lower level, i.e. more detailed, schematic diagram of a comparator circuit having offset calibration/removal according to an example of the present invention.

FIG. 4 shows a more detailed, lower level, schematic diagram of a comparator circuit having offset calibration/removal according to an example of the present invention. This particularly shows the additional portions of the circuit typically found within comparator/operational amplifier unit 140 of FIG. 2, as well as additional control logic and other components of the invention.

Figure 5:
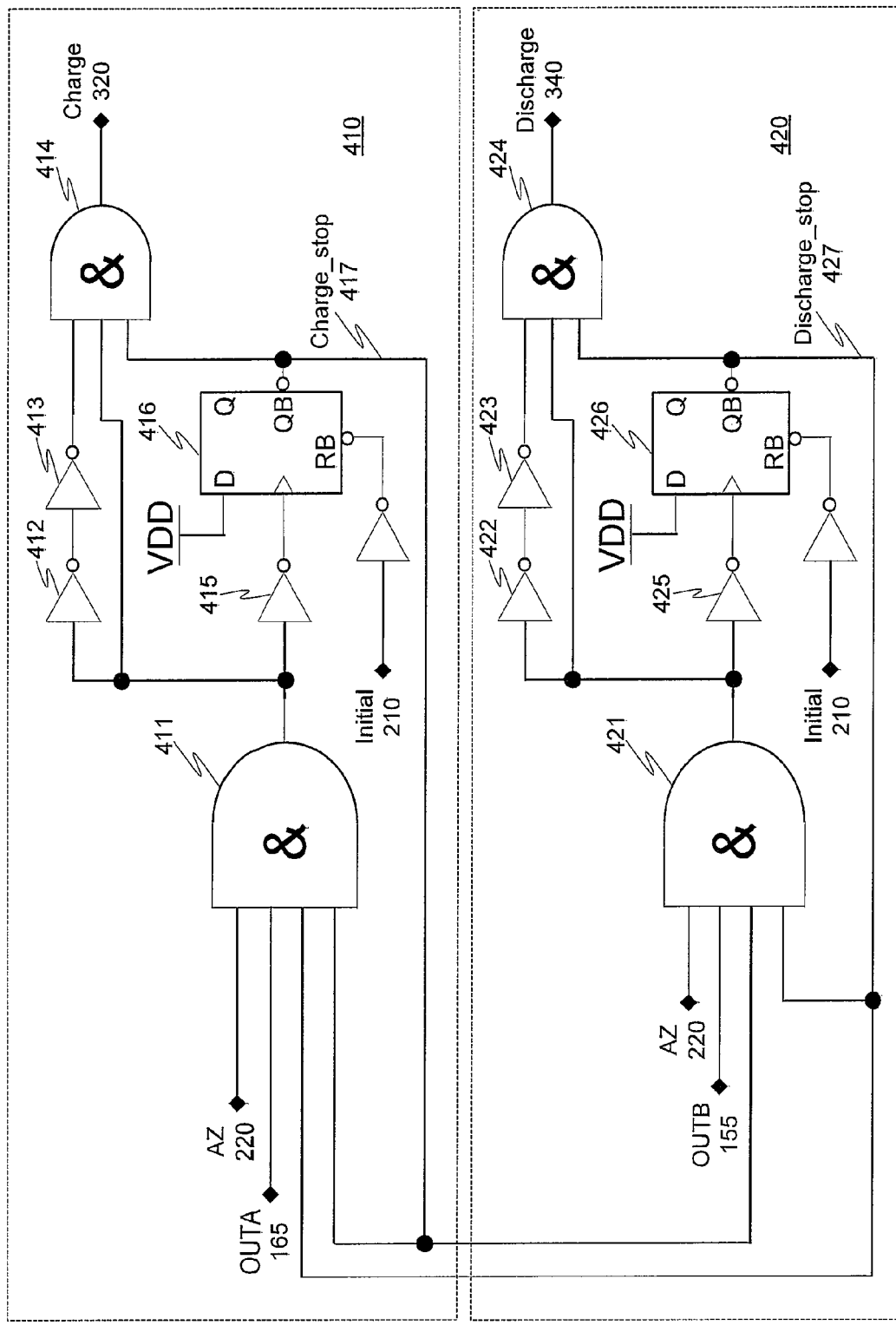
FIG. 5 shows an example implementation of a portion of the control logic to control the circuit of FIG. 4, according to an example of the present invention.

FIG. 5 is an example implementation of a portion of the control logic to control the circuit of FIG. 4, as shown by the relevant signals, the operation of which is described in detail below. The control circuits of FIG. 4 comprise a charge control circuit 410 and corresponding discharge control circuit 420. The exact form of the control circuits is not important, per se, but more their logical operation.

The example charge control circuit 410 comprises a first four input AND gate 411 coupled to a clock input of a D-latch 416 via a NOT gate 415. The D-latch data input is connected to a fixed voltage, for example, to a positive supply rail, Vdd. Meanwhile, the output of the first AND gate 411 is also coupled both directly to a second, three input AND gate 414, and to the same second three input AND gate 414 via a first NOT gate 412 and a second NOT gate 413, the NOT gates 412 and 413 in series with one another, which act together as a delay. Meanwhile, the third input to the three input AND gate 414 is the inverted output (QB) of the D-latch 416, which also acts at a charge_stop signal 417, feeding back to the first, four input, AND gate 411. The other inputs to the first, four input AND gate 411 are the OUTA 165 and AZ 220 signals described above, and which also control other entities in the overall circuit in synergy with this charge control circuit 410, such as the discharge control circuit 420. The final input to the four input, first, AND gate 411 is the discharge_stop signal 427, which is an output of the corresponding discharge control circuit 420, which almost exactly mirrors the construction of the charge control circuit 410, except for its signal use i.e. it is for discharging, not charging, and uses different input signals (e.g. particularly the use of the OUTB 155 signal, etc.). The charge control circuit 410 provides the charge_signal output 320, the use of which is described in detail below.

The discharge control circuit 420 comprises logic (similarly arranged to the charge control circuit 410 discussed above), using a respective third, four input AND gate 421, another, second, D latch 426 (connected to add e.g. Vdd, etc., as discussed above), a fourth, three input AND gate 424, three more NOT gates 422, 423 and 425 (one coupled between the clock input to the D-latch and third AND gate 421 output, and the other two coupled in series between the AND gate 421 and fourth AND gate 424). The D-latch provides the discharge_stop signal 427, the use of which is described in detail below. The two circuits 410 and 420 operate so that they are mutually exclusively in use, dependent upon the polarity of the input offset voltage (which in turn may depend on the specific formation of the comparator, it construction type, and/or how it is connected up, as discussed elsewhere).

Figure 6:
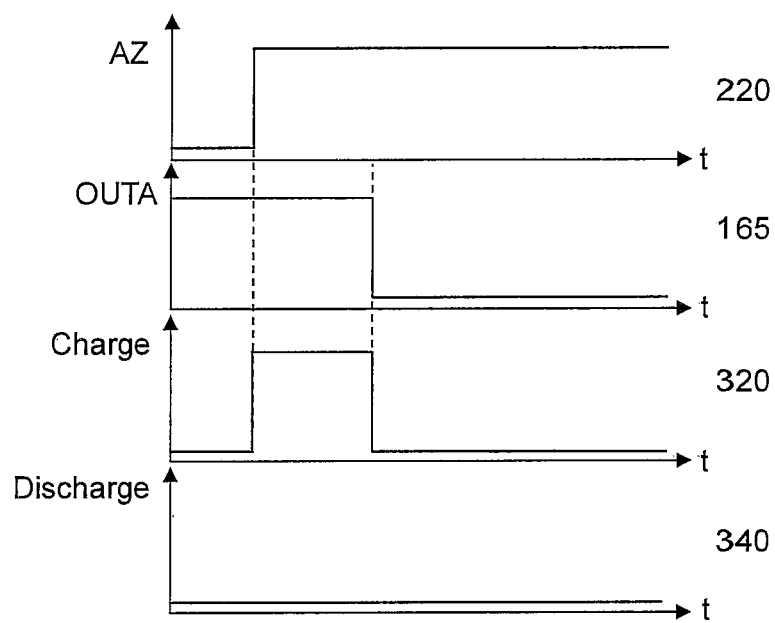
FIG. 6 is a timing diagram of the relevant operational signals for the charge portion of the control circuit shown in FIG. 5.

FIG. 6 shows the timing diagram of the relevant operational signals for the comparator circuit shown in FIGS. 4 and 5, with a positive voltage applied to the Vn input (i.e. Vos on Vn>0), hence using the charge control circuit 410 portion.

Figure 7:
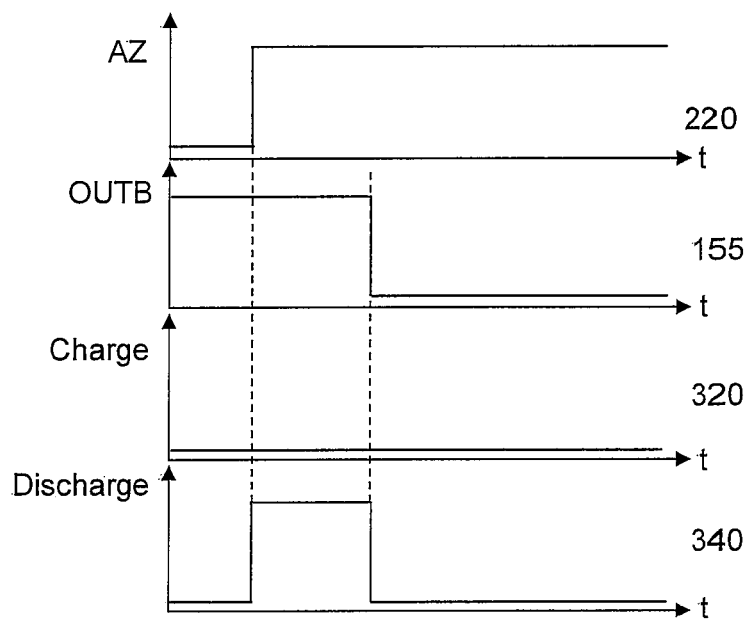
FIG. 7 shows the timing diagram of the relevant operational signals for the discharge portion of the control circuit shown in FIG. 5.

FIG. 7 shows the timing diagram of the relevant operational signals for the comparator circuit shown in FIGS. 4 and 5, with a positive voltage applied to the Vp input (i.e. Vos on Vn<0), hence using the discharge control circuit 420 portion of FIG. 5 in particular.

Figure 8:
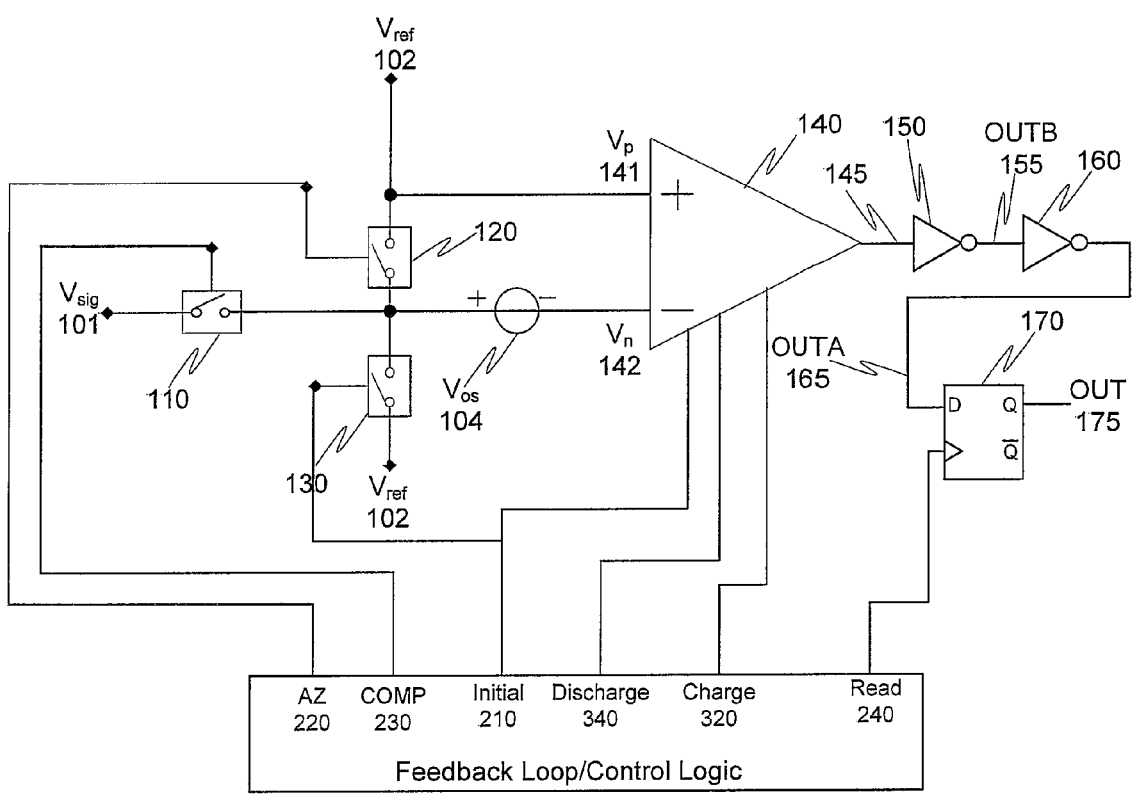
FIG. 8 shows the higher level schematic diagram of FIG. 2, but further including the control logic arranged to provide the relevant control signals described previously, by operation of the control logic of FIG. 5, according to an example of the present invention.

FIG. 8 shows the higher level schematic diagram of FIG. 2, but further including the control logic arranged to provide the relevant control signals described previously, by operation of the control logic of FIG. 5.

For this explanation, we assume there is offset voltage, labelled as Vos 104 in FIG. 2, and it is a positive voltage (i.e. Vos>0, from point of view of Vn 142) applied to Vn 142. However, a Vos 104 on Vp 141 (i.e. greater than zero, from point of view of Vp 141) could be equivalently be seen as a negative voltage (from point of view of Vn 142) and applied to Vn 142 (i.e. a voltage applied to Vn 142 with negative sign). Where the voltage is negative on input Vn 142, then the discharge control circuit 420 is mainly used. Note the polarity of voltages and how they affect the circuit/selection of charge control circuit 410 or discharge control circuit 420, as described below with reference to FIG. 5, will also be dependent on whether it is the Vp transistor (M1—302) or Vn transistor (M0—301) which has its source directly connected to its body (not through a switch).

During the Initial phase, switch A0 311 is turned on by action of signal Initial 210, therefore the body of transistor M0 301 will be connected with its source and this voltage is stored in an input voltage offset (cancellation) capacitor C0 360, coupled between the inverting input transistor M0 301 body and ground. Meanwhile, transistor M1's 302 body and source are always (permanently) connected in this example configuration, as shown in FIG. 5. Alternative configurations may swap round the connections of M0 and M1—i.e. the capacitor C0 could be applied on Vp's transistor M1 302 body, and the permanent body source connection be applied to transistor M0 301, instead. The configuration shown in the figures may be used in preference so that the permanent body-source connected transistor is used for the (inverting) reference input.

The size of the input voltage offset capacitor, C0, i.e. that used for cancelling the input offset voltage as described herein (i.e. cancellation capacitor), may affect the stability of the voltage stored in that capacitor, during use according to examples of the invention. The size and type of capacitor may therefore be comparator implementation (or use-case) specific, for example being a trade-off between required stability and available space on die, and/or capabilities of the manufacturing processes being used to form the integrated circuit including the invention (e.g. due to the di-electric formation abilities of the chosen IC manufacturing process, and the like).

At the end of Initial phase, threshold voltages of M0 301 and M1 320 may be largely equal to each other.

In the offset cancelation (AZ) phase, both Vp 141 and Vn 142 are connected with Vref 102. Vp is permanently connected to Vref 102, whereas Vn 142 is only temporarily connected through the second switch 120 under control of signal AZ 220.

Due to existence of Vos 104, M0's 301 gate is lower than M1's 320, so M0's 301 current is higher than M1's current. Thus, output 145 will rise, so that OUTA 165 will go to logic '1' and OUTB will go to logic '0'. The charge_stop signal 417 and discharge_stop signal 427 may be reset to logic '1' by Initial(isation) signal 210. Then the 'Charge' signal 320 will become logic '1' and switch A1 330 is on, whereas switch A2 is off. Thus, current from transistor M9 will charge offset cancellation capacitor C0 360 which results in M0's 301 body voltage rising up. For PMOS implementation, M0's 301 threshold voltage (|Vthp|) will increase (i.e. Vthp becomes more negative). As a result, M0's 301 current will decrease and so M1's 302 current will increase. This situation will continue until OUTA 165 and OUTB 155 change (i.e. flip) their logic states. As soon as OUTA 165 changes to logic '0', 'Charge' 320 becomes '0' quickly too and so switch A1 330 turns off. The charge_stop signal 417 (see FIG. 6) ensures switch A2 330 is also off at this time. Thus, the voltage of M0's 301 body is stored on capacitor C0 360 and will be a fixed value until the next initial(ization) phase. The timing diagram of logic signals is depicted in FIG. 6.

In the COMP (i.e. comparison) 230 phase, the increased threshold voltage (|Vthp|) of M0 301, under action of offset cancellation capacitor C0 360, will cancel the impact of Vos 104, so that the comparator circuit will act as an ideal comparator, without any input offset.

Similar to above, if Vos<0 (from point of view of Vn 142), body of M0 301 will be discharged in AZ phase, and so use the comparable discharge circuit 420 portion of FIG. 5, and the timing diagram is shown in FIG. 7.

Accordingly a new offset cancellation comparator with self-controlled body biasing apparatus and method is described, which does not need any additional auxiliary (biasing) amplifier structure(s), such as an offset biasing auxiliary amplifier (with its own attendant offset issues to be resolved otherwise), thus examples use less dies size, and the overall circuit is less complex. This is because the comparator 140 (i.e. the target of the offset cancellation) is itself controlling the creation of a suitable offset voltage being stored in the offset cancellation capacitor C0 360, where the polarity of this offset voltage is dependent upon the polarity of the inherent input offset caused by manufacturing process variation of the comparator component devices, particularly the differential transistors, e.g. M0 301 and M1 302.

Examples of the invention therefore provide a method of removing input offset voltages on a comparator, which do not use an auxiliary amplifier to control a biasing voltage, as described in detail above. In summary, the disclosed method acts to use the comparator to be offset itself to control the charging or discharging of a capacitor to a suitable level (i.e. to a correct equal and opposite voltage to the input offset voltage) to remove the input offset, all under control of a control logic based upon the output of the comparator to which the input offset is to be applied.

Whilst the foregoing has been described in terms of PMOS differential amplifier based comparators, due to a recent tendency towards PMOS comparator implementations because of, for example, reduced voltage level requirements for PMOS, the invention is not so limited, and may equally be applied (suitably rearranged for voltage polarity and the like) with NMOS implementations, or other transistor technologies, for any and all comparators or operational amplifiers.

The invention may also be implemented in a computer program for running on a computer system, at least including code portions for performing design of an integrated circuit or portion thereof (e.g. a function block), or the steps of a method according to the invention when run on a programmable apparatus, such as a computer system or enabling a programmable apparatus to perform functions of a device or system according to the invention.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like, where used, in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Also, numerical assignments of first, second, third, fourth, etc, are only meant to help differentiate the different portions that may otherwise be similarly named, and are not to be construed as a limitation, as such, to the described or claimed subject matter.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Thus, it is envisioned that any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, an analog device, or mixed signal device, or integrated circuit, including at least one comparator based unit, such as an analog to digital converter (ADC) or the like, for use in an overall system of the integrated circuit, for example a System on Chip having one or more processing units and ancillary units, including the one or more comparator based unit. Alternatively, the examples may be implemented as any number of separate integrated circuits or separate devices interconnected with each other in a suitable manner, for example as a discrete ADC for use with other discrete units, such as a discrete processing unit, or CPU, or the like.

Also for example, the examples, or portions thereof, may implemented as soft or code representations of physical circuitry or of logical representations convertible into physical circuitry, such as in a hardware description language of any appropriate type, or one or more pre-defined module(s) thereof for re-use in multiple IC designs, in one or more instances. The parameters of these one or more instances may be varied without departing from the teachings herein, since the specific values of the components for each instance may be use specific, but not functionally different, for example.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

Unless otherwise stated as incompatible, or the physics or otherwise of the embodiments prevent such a combination, the features of the following claims may be integrated together in any suitable and beneficial arrangement. This is to say that the combination of features is not limited by the claims specific form, particularly the form of the dependent claims, such as claim numbering and the like.

The invention claimed is:

1. An apparatus to remove an input offset voltage of a comparator circuit, comprising:
    an input voltage offset capacitor;
    control logic operable to charge and discharge the capacitor to provide an offset cancelation voltage to remove the input offset voltage of the comparator circuit dependent upon an output of the comparator circuit; and
    a switching arrangement operable under control of the control logic to switch signals between the capacitor and the control logic,
    wherein the capacitor removes the input offset voltage of the comparator circuit by altering the body bias voltage of one of a plurality of input transistors of the comparator circuit.

2. The apparatus of claim 1, wherein the capacitor is arranged between a body of the one of the plurality of input transistors of the comparator circuit and a reference voltage.

3. The apparatus of claim 1, wherein the control logic comprises a charge control circuit operable to control the charging of the capacitor and a discharge control circuit operable to control the discharging of the capacitor.

4. The apparatus of claim 3, wherein the control logic comprises at least two NOT gates in series operably coupled to the output of the comparator circuit and arranged to provide a first control signal (OUTA) and a second control signal (OUTB), wherein the first control signal (OUTA) controls the charge control circuit and the second control signal (OUTB) controls the discharge control circuit.

5. The apparatus of claim 4, wherein the first control signal (OUTA) is the output of the second NOT gate and the second control signal (OUTB) is the output of the first NOT gate.

6. The apparatus of claim 4, wherein the control logic further comprises a D-latch operably coupled after the two NOT gates to provide a latched output of the comparator circuit under control of a read signal.

7. The apparatus of claim 4, wherein the charge control circuit is operably dependent upon the first control signal (OUTA) and an offset activation signal, and the discharge control circuit is operably dependent upon the second control signal (OUTB) and the offset activation signal.

8. The apparatus of claim 1, wherein the switching arrangement comprises a first switch operably coupled between an input signal and a second input of the comparator circuit, and activated by a comparison signal.

9. The apparatus of claim 8, wherein the switching arrangement comprises a second switch coupled between the second input of the comparator circuit and a first input of the comparator circuit, and activated by an offset activation signal.

10. The apparatus of claim 9, wherein the switching arrangement comprises a third switch coupled between the second input of the comparator circuit and a reference voltage, and activated by an initialization signal.

11. The apparatus of claim 10, wherein the first input of the comparator circuit is operably coupled to the reference voltage.

12. The apparatus of claim 10, wherein the comparator circuit includes the plurality of input transistors and the switching arrangement comprises a fourth switch coupled between a body and a source of one of the input transistors of the comparator circuit having the capacitor coupled thereto.

13. A method of removing an input offset voltage from a comparator comprising:
    charging or discharging an input voltage offset capacitor coupled between a body of one of a plurality of input differential transistors forming the comparator when another one of the plurality of input differential transistors forming the comparator has its source and body coupled together;

wherein the charging or discharging of the input voltage offset capacitor occurs in response to a signal dependent upon a change of output of the comparator due to the input offset voltage acting on nominally equal input voltages.

14. The method of claim 13, further comprising initially charging the input voltage offset capacitor to equal a reference voltage by a plurality of switches.

15. The method of claim 14, further comprising comparing two inputs voltages with the comparator in a comparison stage after said initial charging.

16. The method of claim 13, wherein charging is used for an apparent positive input offset voltage acting on an inverting input of the comparator and discharging is used for an apparent negative input offset voltage acting on the inverting input of the comparator.

\* \* \* \* \*